United States Patent
Pai

(10) Patent No.: US 8,941,012 B2
(45) Date of Patent: Jan. 27, 2015

(54) FLEXIBLE CIRCUIT BOARD AND GROUND LINE STRUCTURE

(71) Applicant: Novatek Microelectronics Corp., Hsinchu (JP)

(72) Inventor: Yu-Chang Pai, Hsinchu County (TW)

(73) Assignee: Novatek Microelectronics Corp., Hsinchu (TW)

( * ) Notice: Subject to any disclaimer, the term of this patent is extended or adjusted under 35 U.S.C. 154(b) by 137 days.

(21) Appl. No.: 13/792,243

(22) Filed: Mar. 11, 2013

(65) Prior Publication Data

US 2014/0231121 A1    Aug. 21, 2014

(30) Foreign Application Priority Data

Feb. 20, 2013  (TW) .............. 102105900 A

(51) Int. Cl.
*H05K 1/09* (2006.01)
*H05K 1/02* (2006.01)

(52) U.S. Cl.
CPC .............. *H05K 1/0228* (2013.01); *H05K 1/09* (2013.01)
USPC ........................................ 174/254

(58) Field of Classification Search
USPC ........................................ 174/255, 260, 254
See application file for complete search history.

(56) References Cited

U.S. PATENT DOCUMENTS

| | | | |
|---|---|---|---|
| 6,184,478 B1 | 2/2001 | Imano et al. | |
| 6,559,377 B1 * | 5/2003 | Noda et al. | ............. 174/36 |
| 7,473,854 B2 * | 1/2009 | Honjo et al. | ............. 174/261 |
| 7,663,063 B2 * | 2/2010 | Lin et al. | ............. 174/255 |
| 2003/0136984 A1 * | 7/2003 | Masuda et al. | ............. 257/247 |
| 2010/0096170 A1 * | 4/2010 | Lin et al. | ............. 174/255 |

FOREIGN PATENT DOCUMENTS

TW        200952571        12/2009

OTHER PUBLICATIONS

"Notice of Allowance of Taiwan Counterpart Application", issued on Jun. 26, 2014, p. 1-p. 4.

* cited by examiner

*Primary Examiner* — Timothy Thompson
*Assistant Examiner* — Michael F McAllister
(74) *Attorney, Agent, or Firm* — Jianq Chyun IP Office

(57) ABSTRACT

A ground line structure adapted to a flexible circuit board is provided. The ground line structure includes a plurality of ground line structure units located on the flexible circuit board to form a meshed pattern. The ground line structure units include a plurality of ground line edge segments, a ground line middle segment and a plurality of ground line connecting segments. The ground line edge segments define an edge shape of each ground line structure unit. The edge shape of each ground line structure unit is a hexagon. The ground line connecting segments are configured to connect the ground line middle segment and the ground line edge segments. The ground line edge segments, the ground line middle segment and the ground line connecting segments form a plurality of pentagonal electrode structures within the hexagonal ground line structure unit. A flexible circuit board including the ground line structure is also provided.

30 Claims, 4 Drawing Sheets

FLEXIBLE CIRCUIT BOARD AND GROUND LINE STRUCTURE

CROSS-REFERENCE TO RELATED APPLICATION

This application claims the priority benefit of Taiwan application serial no. 102105900, filed on Feb. 20, 2013. The entirety of the above-mentioned patent application is hereby incorporated by reference herein and made a part of this specification.

BACKGROUND

1. Technical Field

The disclosure relates to a circuit board and a ground line structure. Particularly, the disclosure relates to a flexible circuit board and a ground line structure.

2. Related Art

Along with development of electronic technology, various electronic products are widely used in people's daily life and work, especially the most commonly used electronic produces such as information products and home appliances, etc. In order to implement a specific function, the electronic product generally includes a printed circuit board in collaboration with a proper circuit layout to implement the specific function. The printed circuit board generally transmits electrical signals through a ground line structure and a signal line structure therein. Based on different applications, the printed circuit boards are usually grouped into rigid printed circuit boards and flexible printed circuit boards. The rigid printed circuit board generally uses a whole slice copper thin film layer as the ground line structure, and the signal line structure is disposed thereon, and the ground line structure and the signal line structure are used in collaboration to transmit electrical signals.

However, in an application of the flexible printed circuit board, the whole slice copper thin film layer may decrease flexibility of the printed circuit board. Therefore, according to the conventional technique, the ground line structure is designed in a meshed pattern to achieve flexibility of the flexible printed circuit board. However, the design of the meshed pattern may result in a fact that different signal lines of the signal line structure have different impedances relative to the ground line structure, which leads to a great difference in propagation delay between the signal lines. Taking a differential signal as an example, if the difference of the propagation delays is too large, besides a problem of signal skew, an excessive common mode noise is also generated.

SUMMARY

An exemplary embodiment of the disclosure is directed to a ground line structure, which is capable of decreasing signal noise and signal skew.

An exemplary embodiment of the disclosure is directed to a flexible circuit board including the aforementioned ground line structure, which is capable of decreasing signal noise and signal skew.

An exemplary embodiment of the disclosure provides a ground line structure, which is adapted to a flexible circuit board. The ground line structure includes a plurality of ground line structure units located on the flexible circuit board to form a meshed pattern. Each of the ground line structure units includes a plurality of ground line edge segments, a ground line middle segment and a plurality of ground line connecting segments. The ground line edge segments define an edge shape of each of the ground line structure units. The edge shape of each of the ground line structure units is a hexagon. The ground line connecting segments are configured to connect the ground line middle segment and the ground line edge segments. The ground line edge segments, the ground line middle segment and the ground line connecting segments form a plurality of pentagonal electrode structures within the hexagonal ground line structure unit.

In an exemplary embodiment of the disclosure, the pentagonal electrode structures include four pentagonal electrode structures configured in pairs relative to the ground line middle segment.

In an exemplary embodiment of the disclosure, the edge shapes of the four pentagonal electrode structures are the same by pairs.

In an exemplary embodiment of the disclosure, the edge shapes of the four pentagonal electrode structures are the same.

In an exemplary embodiment of the disclosure, the pentagonal electrode structures include two first pentagonal electrode structures and two second pentagonal electrode structures. Two of the ground line edge segments, the ground line middle segment and two of the ground line connecting segments commonly define the edge shape of each of the first pentagonal electrode structures. Three of the ground line edge segments and two of the ground line connecting segments commonly define the edge shape of each of the second pentagonal electrode structures.

In an exemplary embodiment of the disclosure, each of the pentagonal electrode structures and the adjacent pentagonal electrode structure share at least one ground line connecting segment. Each of the pentagonal electrode structures and the adjacent pentagonal electrode structure share at least one ground line edge segment.

In an exemplary embodiment of the disclosure, the edge shapes of the pentagonal electrode structures are all the same.

In an exemplary embodiment of the disclosure, the edge shapes of the pentagonal electrode structures are not completely the same.

An exemplary embodiment of the disclosure provides a flexible circuit board including a flexible circuit substrate and the aforementioned ground line structure. The ground line structure is disposed on at least one surface of the flexible circuit substrate.

In an exemplary embodiment of the disclosure, the flexible circuit board further includes a signal line structure. The signal line structure is arranged on the ground line structure to transmit an electrical signal in collaboration with the ground line structure.

In an exemplary embodiment of the disclosure, the flexible circuit board further includes an insulation layer. The insulation layer is disposed between the ground line structure and the signal line structure.

An exemplary embodiment of the disclosure provides a ground line structure, which is adapted to a flexible circuit board. The ground line structure includes a plurality of ground line structure units located on the flexible circuit board to form a meshed pattern. The ground line structure units include a plurality of ground line edge segments, a ground line middle segment and a plurality of ground line connecting segments. The ground line edge segments define an edge shape of each of the ground line structure units. The ground line edge segments are formed by a plurality of electrode segment pairs, and each of the electrode segment pairs is located on two opposite edges of the edge shape. The ground line connecting segments are configured to connect the ground line middle segment and the ground line edge segments. Two ground line edge segments of one of the electrode segment pairs are arranged along a specific direction, and the ground line middle segment extends along the specific direction.

In an exemplary embodiment of the disclosure, an edge shape of each of the ground line structure units is a hexagon.

In an exemplary embodiment of the disclosure, the ground line edge segments, the ground line middle segment and the ground line connecting segments form a plurality of pentagonal electrode structures within the hexagonal ground line structure unit.

In an exemplary embodiment of the disclosure, one of the electrode segment pairs is substantially perpendicular to the ground line middle segment.

In an exemplary embodiment of the disclosure, the electrode segment pairs are arranged along different directions.

In an exemplary embodiment of the disclosure, any two of the different directions are not perpendicular to each other.

In an exemplary embodiment of the disclosure, the two ground line edge segments in each of the electrode segment pairs are disposed at two opposite sides of the ground line middle segment.

In an exemplary embodiment of the disclosure, two electrode segments of each of the electrode segment pairs are parallel to each other.

In an exemplary embodiment of the disclosure, an included angle between two adjacent ground line edge segments is an obtuse angle.

In an exemplary embodiment of the disclosure, a first part of the ground line connecting segments extends a long a first direction, and a second part of the ground line connecting segments extends a long a second direction. The first direction is not perpendicular to the second direction.

In an exemplary embodiment of the disclosure, an included angle between adjacent ground line connecting segments is an obtuse angle.

In an exemplary embodiment of the disclosure, a first included angle and a second included angle are formed between each of the ground line connecting segments and the ground line edge segment connected thereto. The first included angle is greater than the second included angle.

In an exemplary embodiment of the disclosure, an included angle between each of the ground line connecting segments and the ground line middle segment connected thereto is an obtuse angle.

In an exemplary embodiment of the disclosure, the ground line edge segments include M ground line edge segments, wherein M is an even number.

In an exemplary embodiment of the disclosure, the ground line connecting segments include N ground line connecting segments, wherein N is an even number.

In an exemplary embodiment of the disclosure, M is greater than N.

An exemplary embodiment of the disclosure provides a flexible circuit board including a flexible circuit substrate and the aforementioned ground line structure. The ground line structure is disposed on at least one surface of the flexible circuit substrate.

In an exemplary embodiment of the disclosure, the flexible circuit board further includes a signal line structure. The signal line structure is arranged on the ground line structure to transmit an electrical signal in collaboration with the ground line structure.

In an exemplary embodiment of the disclosure, the flexible circuit board further includes an insulation layer. The insulation layer is disposed between the ground line structure and the signal line structure.

According to the above descriptions, in the exemplary embodiment of the disclosure, the ground line structure of the meshed pattern has high evenness, and the signal line structure is arranged on the ground line structure to decrease noise of the transmitted electrical signal.

In order to make the aforementioned and other features and advantages of the disclosure comprehensible, several exemplary embodiments accompanied with figures are described in detail below.

BRIEF DESCRIPTION OF THE DRAWINGS

The accompanying drawings are included to provide a further understanding of the disclosure, and are incorporated in and constitute a part of this specification.

The drawings illustrate embodiments of the disclosure and, together with the description, serve to explain the principles of the disclosure.

DETAILED DESCRIPTION OF DISCLOSED EMBODIMENTS

Figure 1:
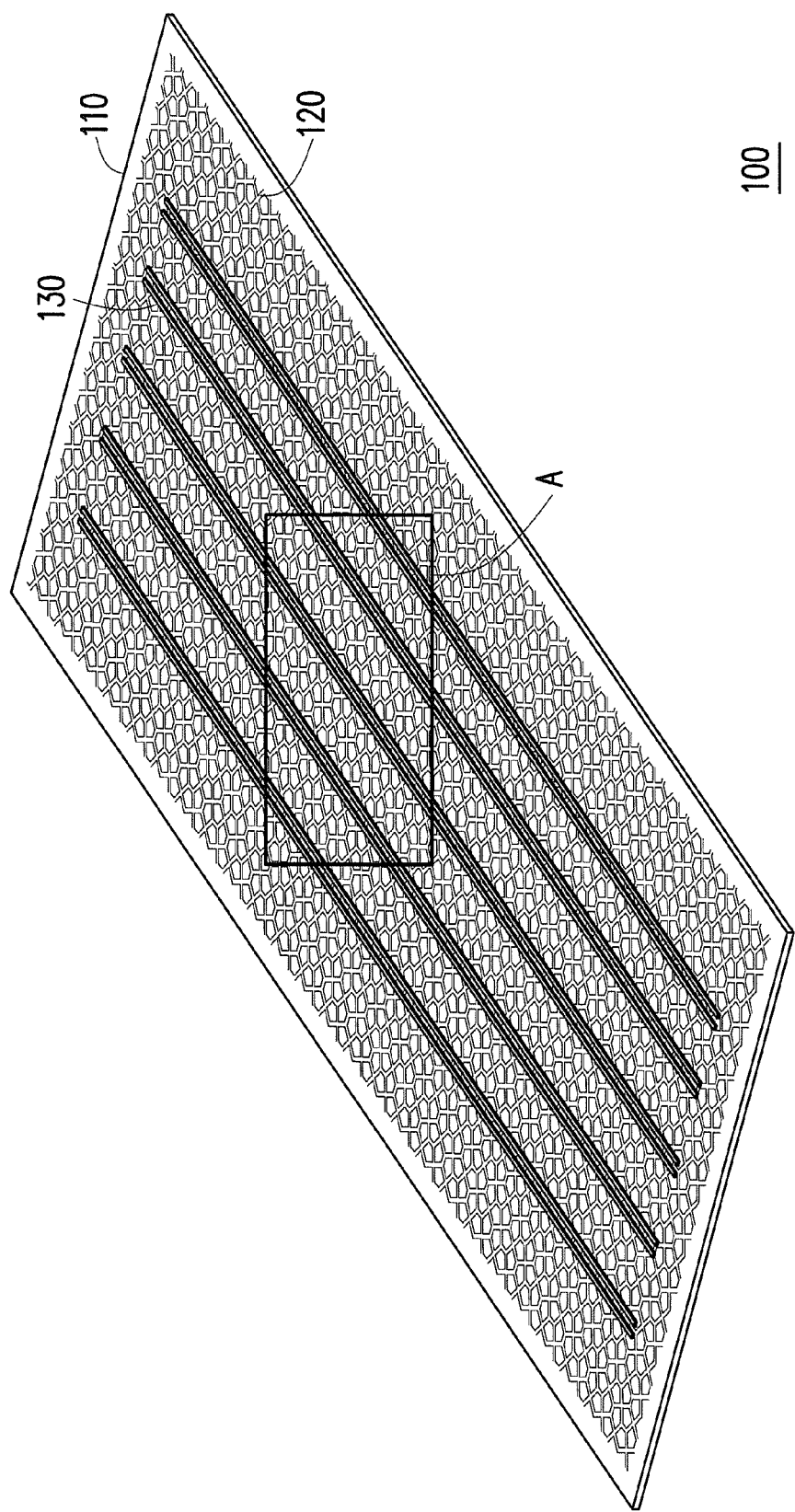
FIG. 1 is a schematic diagram of a flexible circuit board according to an embodiment of the disclosure.
Figure 2:
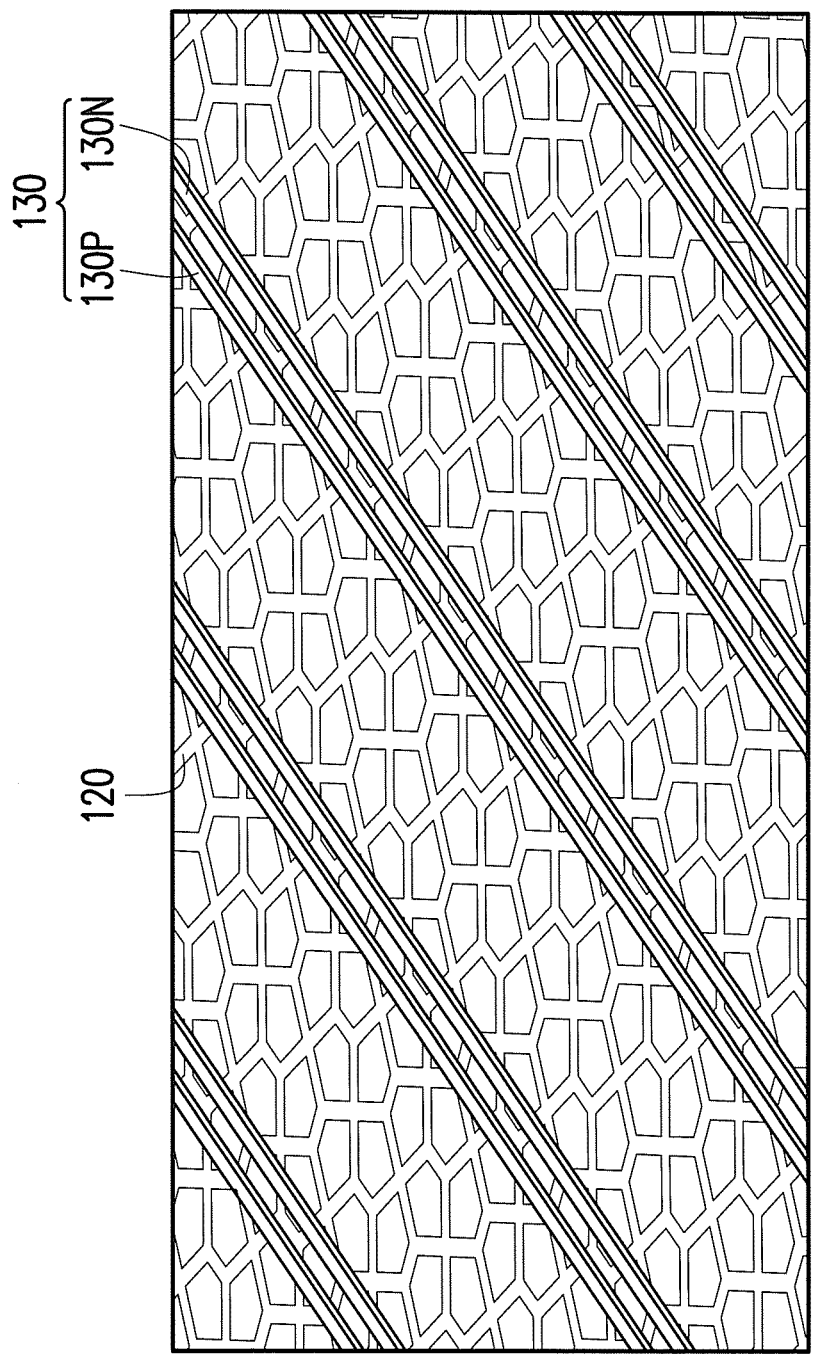
FIG. 2 is an enlarged view of a block A of the flexible circuit board of FIG. 1.

Referring to FIG. 1 and FIG. 2, FIG. 1 is a schematic diagram of a flexible circuit board according to an embodiment of the disclosure. FIG. 2 is an enlarged view of a block A of the flexible circuit board of FIG. 1. The flexible circuit board 100 of the present embodiment includes a flexible circuit substrate 110, a ground line structure 120 and a signal line structure 130. The ground line structure 120 is disposed on the flexible circuit substrate 110, and is configured to provide a common voltage to serve as a reference level of electrical signals. The ground line structure 120 has a meshed electrode pattern to fit the characteristic of flexibility of the flexible circuit board 100. The signal line structure 130 is distributed on the ground line structure 120 to transmit the electrical signals in collaboration with the ground line structure 120. Taking differential signals as an example, the signal line structure 130 of the present embodiment may include a plurality pairs of signal lines 130P and 130N, and as shown in FIG. 2, the signal lines 130P and 130N are used to transmit positive and negative signals of the differential signals. Moreover, the flexible circuit board 100 may further include a middle layer, for example, an insulation layer (not shown), which is disposed between the ground line structure 120 and the signal line structure 130 to insulate the ground line structure 120 and the signal line structure 130 to avoid electrical connection there between. It should be noticed that the signal line structure 130 of FIG. 1 is only used as an example, and the disclosure is not limited thereto. According to different circuit design methods, a layout of the signal line structure 130 can be different.

In the conventional technique, the ground line structure with the meshed electrode pattern probably results in a fact that different signal lines of the signal line structure have different impedances relative to the ground line structure, which leads to a great difference in propagation delay between the signal lines. According to different layout methods, the positive polarity signal line and the negative polarity signal line are liable to generate different impedances relative to the ground line structure, which may cause different propagation delays of the positive and negative signals of the differential signals. If the difference of propagation delays is too large, besides a problem of signal skew, an excessive common mode noise is also generated.

However, in the exemplary embodiment of FIG. 2, based on the design of the specific meshed pattern of the ground line structure, the problems of signal delay between the positive polarity signal line 130P and the negative polarity signal line 130N and signal skew or noise, etc. can be effectively resolved. In detail, in the exemplary embodiment of FIG. 2, the ground line structure 120 includes a plurality of ground line structure units. The ground line structure units are disposed on the flexible circuit board 100 to form a meshed pattern. The design of the meshed pattern ensures that the signal lines of the signal line structure 130 have similar impedance values relative to the ground line structure 120, so as to decrease the difference of propagation delay between the signal lines. Moreover, according to the exemplary embodiment of the disclosure, the ground line structure units include a plurality of polygon electrode structures, where profiles of the polygon electrode structures can be completely the same or are not completely the same. In order to fully describe the design of the ground line structure of the disclosure, at least one exemplary embodiment is provided below with reference to figures for descriptions.

Figure 3:
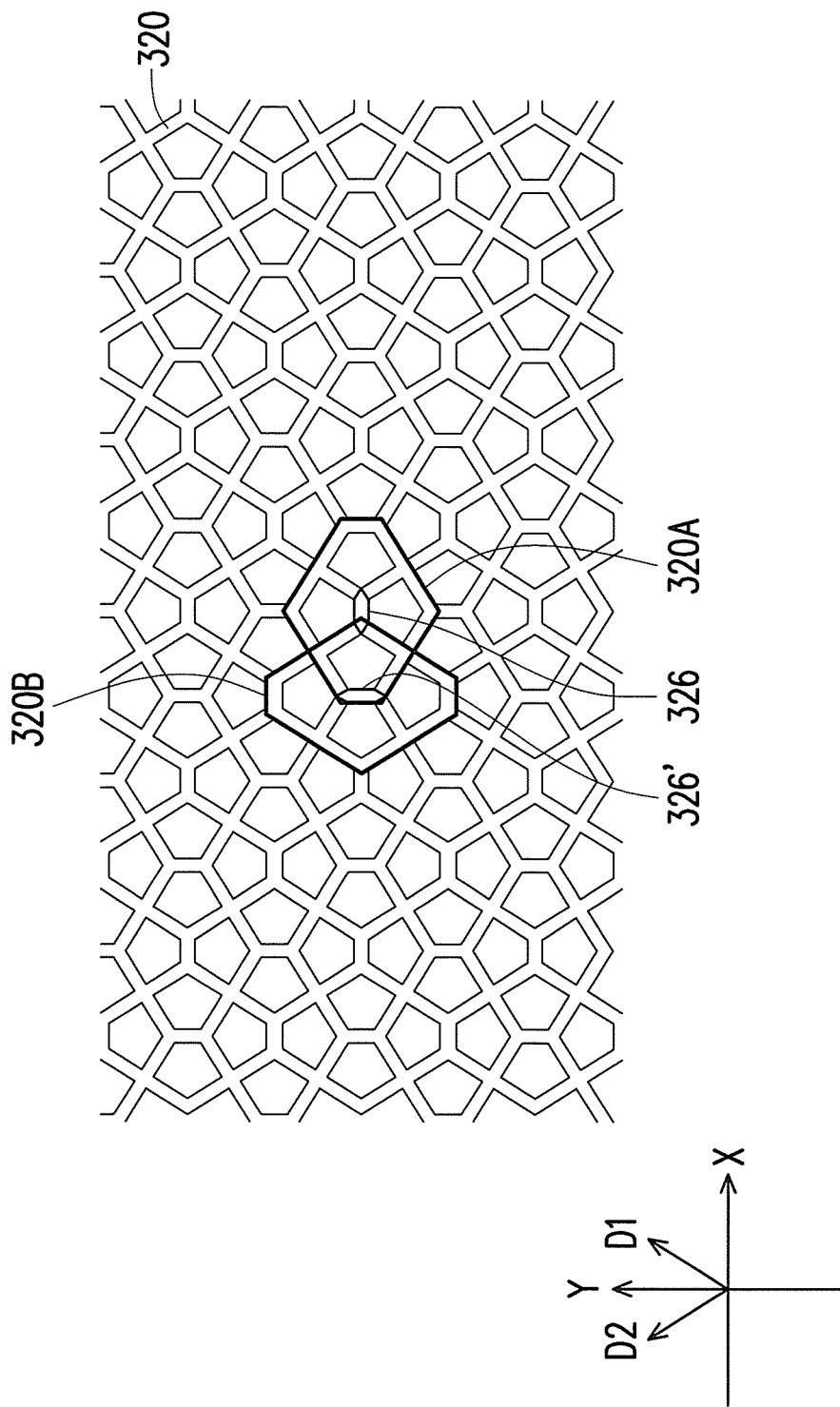
FIG. 3 is a schematic diagram of a ground line structure according to an embodiment of the disclosure.
Figure 4:
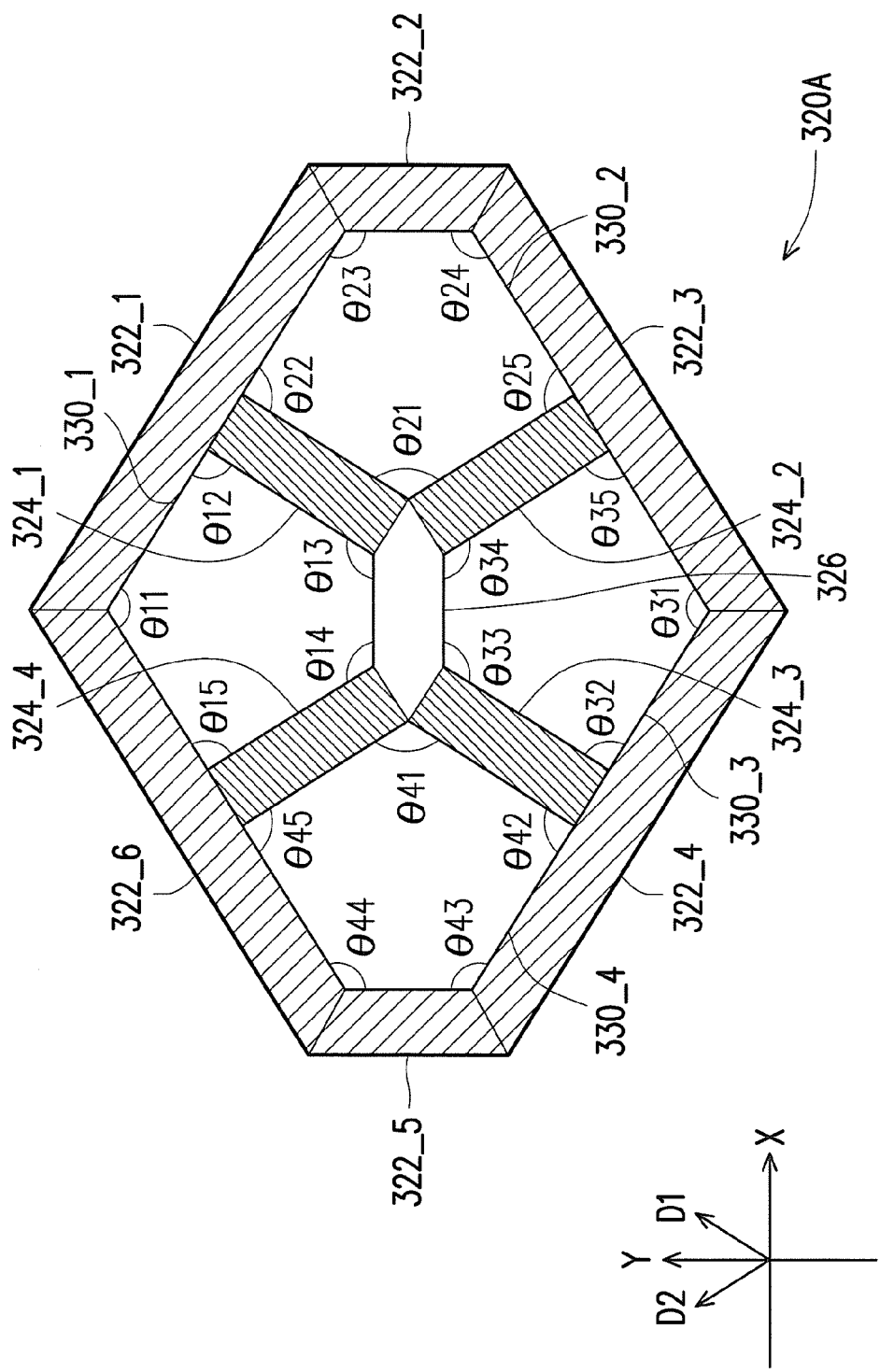
FIG. 4 illustrates details of a ground line structure unit in the ground line structure of FIG. 3.

Referring to FIG. 3 and FIG. 4, FIG. 3 is a schematic diagram of a ground line structure according to an embodiment of the disclosure, and FIG. 4 illustrates details of a ground line structure unit in the ground line structure of FIG. 3. In the present exemplary embodiment, the ground line structure 320 includes a plurality of hexagonal ground line structure units 320A, where the hexagonal ground line structure units 320A are disposed on the flexible circuit board to form a meshed pattern. Each of the ground line structure units 320A includes a plurality of (for example, six) ground line edge segments 322_1-322_6, a ground line middle segment 326 and a plurality of (for example, four) ground line connecting segments 324_1-324_4. The ground line edge segments 322_1-322_6 define an edge shape of the ground line structure unit 320A. In the present embodiment, the edge shape of the ground line structure unit 320A is a hexagon, and the hexagonal structure is only an example of the profile of the polygonal electrode structure, and the disclosure is not limited thereto. The ground line connecting segments 324_1-324_4 are configured to connect the ground line middle segment 326 and the ground line edge segments 322_1-322_6. In the present exemplary embodiment, the ground line edge segments 322_1-322_6, the ground line middle segment 326 and the ground line connecting segments 324_1-324_4 form a plurality of (for example, four pentagonal electrode structures 330_1-330_4 within the hexagonal ground line structure unit 320A.

In detail, in view of the profile of the electrode structure, the pentagonal electrode structures 330_1-330_4 are disposed in pairs relative to the ground line middle segment 326, where the pentagonal electrode structures 330_1 and 330_3 are disposed along a Y-direction relative to the ground line middle segment 326, and the pentagonal electrode structures 330_2 and 330_4 are disposed along an X-direction relative to the ground line middle segment 326. In the present exemplary embodiment, the edge shapes of the pentagonal electrode structures can be the same by pairs or can be all the same, which is determined by the design of the ground line edge segments 322_1-322_6, the ground line middle segment 326 and the ground line connecting segments 324_1-324_4. Design of the edge shape of the electrode structure includes adjusting an arrangement method, an extending direction, and a length of each electrode segment, or adjusting an included angle between the electrode segments. However, in other embodiments, the edge shapes of the pentagonal electrode structures are unnecessary to be the same by pairs or all the same, which can be all different or partially the same.

It should be noticed the hexagonal ground line structure units are not limited to extend along a specific direction, or according to different viewing angles, the hexagonal ground line structure units arranged along different directions are presented. Referring to FIG. 3, in an implementation that the edge shapes of the electrode structures are all the same, the hexagonal ground line structure units 320A and 320B can be regarded as the same ground line structure units, and a main difference there between lies in extending directions of the ground line middle segments 326 and 326'. For example, the ground line middle segment 326 of the ground line structure unit 320A extends along the X-direction, and the ground line middle segment 326' of the ground line structure unit 320B extends along the Y-direction. Therefore, in the implementation that the edge shapes of the electrode structures are all the same, the pentagonal electrode structure located on top of the ground line middle segment 326 in the ground line structure unit 320A may correspond to the pentagonal electrode structure located to the left of the ground line middle segment 326' in the ground line structure unit 320B. In the present embodiment, the other pentagonal electrode structures in the ground line structure units 320A and 320B can be deduced according to the aforementioned relationship, which are not repeated.

Referring to FIG. 4, in an implementation that the edge shapes of the electrode structures are the same by pairs, the pentagonal electrode structures 330_1-330_4 can be roughly grouped into two groups respectively including two first pentagonal electrode structures 330_1 and 330_3 and two second pentagonal electrode structures 330_2 and 330_4. In this example, the edge shape of each of the first pentagonal electrode structures is commonly formed by two of the ground line edge segments 322_1-322_6, the ground line middle segment 326 and two of the ground line connecting segments 324_1-324_4. For example, the ground line edge segments 322_1 and 322_6, the ground line middle segment 326 and the ground line connecting segments 324_1 and 324_4 commonly define the edge shape of the first pentagonal electrode structure 330_1. Moreover, in the present exemplary embodiment, the edge shape of each of the second pentagonal electrode structures is commonly formed by three of the ground line edge segments 322_1-322_6 and two of the ground line connecting segments 324_1-324_4. For example, the ground line edge segments 322_1-322_3 and the ground line connecting segments 324_1 and 324_2 commonly define the edge shape of the second pentagonal electrode structure 330_2. Therefore, in overall, each of the pentagonal electrode structures and the adjacent pentagonal electrode structure share at least one ground line connecting segment. Moreover, each of the pentagonal electrode structures and the adjacent pentagonal electrode structure share at least one ground line edge segment. Taking the pentagonal electrode structures 330_1 and 330_2 as an example, the pentagonal electrode structures 330_1 and 330_2 share the ground line connecting segment 324_1 and the ground line edge segment 322_1.

In view of the electrode segment, in the present exemplary embodiment, the ground line edge segments 322_1-322_6 can be divided into a plurality of electrode segment pairs arranged along different directions, and each of the electrode segment pairs is located on two opposite edges of the edge shape. For example, the ground line boundary segments 322_2 and 322_5 arranged along the X-direction can be grouped into one electrode segment pair, and are respectively located on two opposite edges of the edge shape along the X-direction. Moreover, the electrode segment pair 322_2 and 322_5 is substantially perpendicular to the ground line middle segment 326 extending along the X-direction. Moreover, in the present exemplary embodiment, the two electrode segments of each electrode segment pair are parallel to each other, and are disposed at two sides of the ground line middle segment 326. For example, the electrode segments 322_1 and 322_4 parallel to each other are disposed at two sides of the ground line middle segment 326, and any two of the arranging directions of the electrode segment pairs are not perpendicular to each other, as that shown in FIG. 4.

On the other hand, in the present exemplary embodiment, the ground line connecting segments 324_1 and 324_3 extend along a direction D1, and are respectively configured to connect the ground line edge segments 322_1 with the ground line middle segment 326 and connect the ground line middle segment 326 with the ground line edge segments 322_4. The ground line connecting segments 324_2 and 324_4 extend along a direction D2, and are respectively configured to connect the ground line edge segments 322_3 with the ground line middle segment 326 and connect the ground line middle segment 326 with the ground line edge segments 322_6. It should be noticed that in the present exemplary embodiment, the extending directions D1 and D2 of the ground line connecting segments are not perpendicular to each other, though in another exemplary embodiment, the extending direction D1 and D2 are designed to be perpendicular to each other. Moreover, in the present exemplary embodiment, a number M of the ground line edge segments is greater than a number N of the ground line connecting segments, where M and N are even numbers. It should be noticed that the numbers of the ground line edge segments and the ground line connecting segments are only used as an example, and the disclosure is not limited thereto.

In view of included angles between the electrode segments, in the present exemplary embodiment, included angles θ11, θ23, θ24, θ31, θ43 and θ44 between the adjacent ground line edge segments are obtuse angles. Included angles θ21 and θ41 between the adjacent ground line connecting segments are obtuse angles. Included angles θ13, θ14, θ33, and θ34 between each of the ground line connecting segments and the ground line middle segment are obtuse angles. Moreover, a first included angle and a second included angle are formed between each of the ground line connecting segments and the ground line edge segment connected thereto, where the first included angle is greater than the second included angle. For example, an included angle θ12 and an included angle θ22 are formed between the ground line connecting segment 324_1 and the ground line edge segment 322_1 connected thereto. An included angle θ15 and an included angle θ45 are formed between the ground line connecting segment 324_4 and the ground line edge segment 322_6 connected thereto, where the included angle θ15 is greater than the included angle θ45.

It should be noticed that a basic principle of designing the included angles between the electrode segments may be that the included angles between the electrode segments are not equal to 0, 45 or 90 degrees to increase a chance of randomly matching with the signal line structure. For example, under such a basic principle, it has a high chance that a projection of the signal line structure 130 of FIG. 2 on the ground line structure 120 is intersected with various electrode segments and is not perpendicular thereto, so as to increase a chance that a plurality pairs of signal lines 130P and 130N of the signal line structure 130 randomly match to the ground line structure 120, and accordingly decrease the difference of the propagation delays between the signal lines.

In summary, in the exemplary embodiments of the disclosure, the ground line structure with the meshed pattern can have high evenness, and the signal lines of the signal line structure can have similar impedances relative to the ground line structure. Moreover, by adjusting parameters such as an arrangement method, an extending direction, and a length of each electrode segment, or an included angle between the electrode segments, the edge shape of the electrode structure is changed to increase diversity of the meshed pattern. Therefore, by arranging the signal line structure on the aforementioned ground line structure, signal skew can be mitigated and signal noise can be decreased.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A ground line structure, adapted to a flexible circuit board, comprising:
    a plurality of ground line structure units, located on the flexible circuit board to form a meshed pattern, and each of the ground line structure units comprises:
        a plurality of ground line edge segments, defining an edge shape of each of the ground line structure units, wherein the edge shape of each of the ground line structure units is a hexagon;
        a ground line middle segment; and
        a plurality of ground line connecting segments, configured to connect the ground line middle segment and the ground line edge segments,
    wherein the ground line edge segments, the ground line middle segment and the ground line connecting segments form a plurality of pentagonal electrode structures within the hexagonal ground line structure unit.

2. The ground line structure as claimed in claim 1, wherein the pentagonal electrode structures comprise four pentagonal electrode structures configured in pairs relative to the ground line middle segment.

3. The ground line structure as claimed in claim 2, wherein the edge shapes of the four pentagonal electrode structures are the same by pairs.

4. The ground line structure as claimed in claim 2, wherein the edge shapes of the four pentagonal electrode structures are the same.

5. The ground line structure as claimed in claim 1, wherein the pentagonal electrode structures comprise:
    two first pentagonal electrode structures, wherein two of the ground line edge segments, the ground line middle segment and two of the ground line connecting segments commonly define the edge shape of each of the first pentagonal electrode structures; and
    two second pentagonal electrode structures, wherein three of the ground line edge segments and two of the ground line connecting segments commonly define the edge shape of each of the second pentagonal electrode structures.

6. The ground line structure as claimed in claim 1, wherein each of the pentagonal electrode structures and the adjacent pentagonal electrode structure share at least one of the ground line connecting segments, and each of the pentagonal electrode structures and the adjacent pentagonal electrode structure share at least one of the ground line edge segments.

7. The ground line structure as claimed in claim 1, wherein the edge shapes of the pentagonal electrode structures are all the same.

8. The ground line structure as claimed in claim 1, wherein the edge shapes of the pentagonal electrode structures are not completely the same.

9. A flexible circuit board, comprising:
a flexible circuit substrate; and
the ground line structure as claimed in claim 1, disposed on at least one surface of the flexible circuit substrate.

10. The flexible circuit board as claimed in claim 9, further comprising a signal line structure, disposed on the ground line structure to transmit an electrical signal in collaboration with the ground line structure.

11. The flexible circuit board as claimed in claim 10, further comprising an insulation layer, disposed between the ground line structure and the signal line structure.

12. A ground line structure, adapted to a flexible circuit board, comprising:
a plurality of ground line structure units, located on the flexible circuit board to form a meshed pattern, wherein each of the ground line structure units comprises:
a plurality of ground line edge segments, defining an edge shape of each of the ground line structure units, wherein the ground line edge segments are formed by a plurality of electrode segment pairs, and each of the electrode segment pairs is located on two opposite edges of the edge shape;
a ground line middle segment; and
a plurality of ground line connecting segments, configured to connect the ground line middle segment and the ground line edge segments,
wherein two ground line edge segments of one of the electrode segment pairs are arranged along a specific direction, and the ground line middle segment extends along the specific direction.

13. The ground line structure as claimed in claim 12, wherein an edge shape of each of the ground line structure units is a hexagon.

14. The ground line structure as claimed in claim 13, wherein the ground line edge segments, the ground line middle segment and the ground line connecting segments form a plurality of pentagonal electrode structures within the hexagonal ground line structure unit.

15. The ground line structure as claimed in claim 12, wherein one of the electrode segment pairs is substantially perpendicular to the ground line middle segment.

16. The ground line structure as claimed in claim 12, wherein the electrode segment pairs are arranged along different directions.

17. The ground line structure as claimed in claim 16, wherein any two of the different directions are not perpendicular to each other.

18. The ground line structure as claimed in claim 12, wherein the two ground line edge segments in each of the electrode segment pairs are disposed at two opposite sides of the ground line middle segment.

19. The ground line structure as claimed in claim 12, wherein two electrode segments of each of the electrode segment pairs are parallel to each other.

20. The ground line structure as claimed in claim 12, wherein an included angle between two adjacent ground line edge segments is an obtuse angle.

21. The ground line structure as claimed in claim 12, wherein a first part of the ground line connecting segments extends a long a first direction, and a second part of the ground line connecting segments extends a long a second direction, and the first direction is not perpendicular to the second direction.

22. The ground line structure as claimed in claim 12, wherein an included angle between adjacent ground line connecting segments is an obtuse angle.

23. The ground line structure as claimed in claim 12, wherein a first included angle and a second included angle are formed between each of the ground line connecting segments and the ground line edge segment connected thereto, wherein the first included angle is greater than the second included angle.

24. The ground line structure as claimed in claim 12, wherein an included angle between each of the ground line connecting segments and the ground line middle segment connected thereto is an obtuse angle.

25. The ground line structure as claimed in claim 12, wherein the ground line edge segments comprise M ground line edge segments, wherein M is an even number.

26. The ground line structure as claimed in claim 25, wherein the ground line connecting segments comprise N ground line connecting segments, wherein N is an even number.

27. The ground line structure as claimed in claim 26, wherein M is greater than N.

28. A flexible circuit board, comprising:
a flexible circuit substrate; and
the ground line structure as claimed in claim 12, disposed on at least one surface of the flexible circuit substrate.

29. The flexible circuit board as claimed in claim 28, further comprising a signal line structure disposed on the ground line structure to transmit an electrical signal in collaboration with the ground line structure.

30. The flexible circuit board as claimed in claim 29, further comprising an insulation layer disposed between the ground line structure and the signal line structure.

* * * * *